United States Patent [19]

Dermitzakis et al.

[11] Patent Number: 4,609,880

[45] Date of Patent: Sep. 2, 1986

[54] BROAD-BAND AMPLIFIER FOR THE AMPLIFICATION OF A PHOTOELECTRIC CURRENT

[75] Inventors: Stephan Dermitzakis, Heilbronn-Neckargartach; Jasbeer S. Suri, Heilbronn-Klingenberg; Gerhard Krumrein, Neuenstadt; Peter Mischel, Heilbronn, all of Fed. Rep. of Germany

[73] Assignee: Telefunken electronic GmbH, Heilbronn, Fed. Rep. of Germany

[21] Appl. No.: 655,724

[22] Filed: Sep. 28, 1984

[30] Foreign Application Priority Data

Oct. 6, 1983 [DE] Fed. Rep. of Germany ....... 3336366

[51] Int. Cl.$^4$ .............................................. H03F 3/08
[52] U.S. Cl. ....................................... 330/308; 330/59; 330/288
[58] Field of Search ................. 330/59, 288, 308, 311, 330/310, 293; 323/315, 316; 250/214 A

[56] References Cited

U.S. PATENT DOCUMENTS 3,619,798  11/1971  Smith et al. ................... 330/295 X
3,939,434  2/1976  Crosby .............................. 330/288
4,351,916  11/1982  Schude, Jr. ...................... 330/288
4,467,191  8/1984  Chalfin et al. ................. 250/214 A
4,476,443  10/1984  Gomi .................................. 330/288

FOREIGN PATENT DOCUMENTS 3206915  9/1983  Fed. Rep. of Germany .
0067448  6/1982  European Pat. Off. .
1204215  9/1970  United Kingdom .
1410133  10/1975  United Kingdom .

Primary Examiner—Eugene R. LaRoche
Assistant Examiner—Steven J. Mottola
Attorney, Agent, or Firm—Spencer & Frank

[57] ABSTRACT

A broad-band amplifier for the amplification of a photoelectric current triggered by a light signal, including a first transistor connected to receive the photoelectric current, a second transistor connected in series with the first one, a resistance connected between the base of the first transistor and the emitter of the second transistor, a third transistor and a fourth transistor which form a current mirror, the third transistor being connected in series with the second transistor, and a resistance located between the third transistor and ground.

12 Claims, 4 Drawing Figures

BROAD-BAND AMPLIFIER FOR THE AMPLIFICATION OF A PHOTOELECTRIC CURRENT

BACKGROUND OF THE INVENTION

The invention relates to a broad-band amplifier for the amplification of a photoelectric current triggered by a light signal with a first transistor and a second transistor connected in series with the first transistor, wherein a resistance is connected between the base of the first transistor and the emitter of the second transistor.

Broad-band amplifiers of the above-mentioned type are mainly used for the amplification of light signals emitted by semiconductor transmitters such as, for example, lasers or IR diodes. Such amplifiers should have as large a linearity range as possible and low noise characteristics.

SUMMARY OF THE INVENTION

The object of the invention is to indicate a broad-band amplifier for the amplification of photoelectric currents which features greater current amplification at the same band width as known broad-band amplifiers, and which may be integrated.

According to the invention there is provided in a broad-band amplifier of the kind described at the outset a third and a fourth transistor which form a current mirror, by connecting the third transistor in series with the second transistor, and by arranging a resistance between the third transistor and ground.

The third transistor, which is preferably connected as a diode, takes away a part (approximately 0.7 V) of the emitter potential of the second transistor, so that a relatively low voltage remains at the resistance between the third transistor and ground. The resistance between the third transistor and ground may therefore be made very small without the emitter current of the second transistor becoming excessively large. This offers the possibility of rendering the current amplification $V_i = I_3/I_p \approx R_F/R_3$ of the transimpedance preamplifier consisting of the transistor T1 and T2, substantially greater than with known amplifiers of this kind.

Since with the broad-band amplifier according to the invention the third transistor forms a current mirror with the fourth transistor, the emitter current $I_3$ of the third transistor occurs enlarged by the mirror ratio at the collector of the fourth transistor.

According to a further embodiment of the invention, there is provided a fifth transistor whose emitter is coupled with the emitter of the fourth transistor via a resistance. This fifth transistor forms a Schmitt trigger together with the third and fourth transistors. By means of the current mirror formed by the third and fourth transistors it is ensured that when the Schmitt trigger is in the quiescent state, the fourth transistor is not blocked but rather is operated in the active range by a low emitter current.

In another embodiment of the invention, the emitter of the fifth transistor serves as output. In this case, there is no positive feedback via a resistance between the emitter of the fifth transistor and the emitter of the fourth transistor, and, therefore, also no Schmitt trigger function. In the case where the third transistor and the fifth transistor operate as a Schmitt trigger, a sixth transistor is provided as output transistor of the circuit.

BRIEF DESCRIPTION OF THE DRAWINGS

The invention will now be described in greater detail, by way of examples, with reference to the drawings, in which.

DESCRIPTION OF THE PREFERRED EMBODIMENTS

Figure 1:
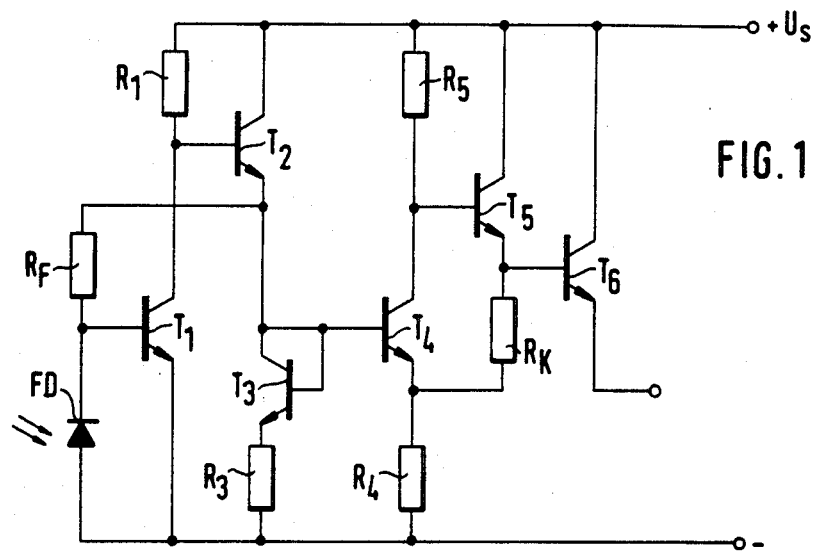
FIG. 1 shows a broad-band amplifier.

FIG. 1 shows a broad-band amplifier according to the invention for the amplification of photoelectric currents in combination with a Schmitt trigger. The amplifier of FIG. 1 is a so-called transimpedance amplifier with the first transistor T1, the second transistor T2, the third transistor T3 and also the fourth transistor T4. Disregarding the resistance, the Schmitt trigger consists of the third transistor T3, the fourth transistor T4, and the fifth transistor T5. The output transistor T6 is located at the output of the circuit arrangement shown in FIG. 1.

In the arangement shown in FIG. 1, the photoelectric current supplied by the photodiode FD is fed to the base of the first transistor T1 whose collector is connected to the base of the second transistor T2. A resistance $R_F$ is arranged between the base of the first transistor T1 and the emitter of the second transistor T2. Located in series with the emitter-collector section of the second transistor T2 is the emitter-collector section of a third transistor T3. A resistance R3 precedes the emitter of the third transistor T3. Transistor T3 is connected as a diode. The current amplification is adjustable through the resistance ratio of the resistance $R_F$ to the resistance R3.

In the circuit shown in FIG. 1, the third transistor T3 forms with a fourth trransistor T4 a current mirror. The emitter current I3 of the third transistor T3 thereby appears at the collector of the fourth transistor T4 enlarged by the current mirror ratio. A resistance R4 precedes the emitter of the fourth transistor T4.

In the circuit arrangement shown in FIG. 1, there is provided a fifth transistor T5 whose emitter is coupled to the emitter of the fourth transistor T4 via a resistance $R_k$. This positive feedback contributes towards the transistors T3, T4 and T5 constituting a Schmitt trigger. Through the current mirror consisting of transistors T3 and T4 is ensured that when the Schmitt trigger is in the quiescent state, the fourth transistor T4 is not blocked but rather operated by means of a small emitter current I4 in the active range. The emitter current I4 is determined by the mirror ratio and the resistance $R_k$. In the active state of the Schmitt trigger, the fifth transistor T5 is blocked and the fourth transistor T4 is saturated.

In the circuit according to FIG. 1, the saturation state of the fourth transistor T4 is controlled by the current mirror (T3, T4) and the resistance $R_k$. The mirror ratio (I3/I4=R4/R3) determines the maximum current I4 at which the fourth transistor T4 still operates in the active range. The maximum current I4 which may flow through the fourth transistor T4 in the saturated state is determined by the resistance $R_k$. With the aid of the mirror ratio as well as $R_k$, it is therefore possible to set the operation of the fourth transistor T4 in such a way that strong saturation is avoided and the transistor T4 operates at the limit between saturation and active range.

As a result of the avoidance of the blocked state as well as the strong saturation of T4 in both of the Schmitt trigger states, the switching times $t_{on}$ and $t_{off}$ of the Schmitt trigger in FIG. 1 become very small. In the realization of the circuit in integrated monolithic technology, switching times of the $t_{on}=50$ nsec and $t_{off}=80$ nsec were attained for the Schmitt trigger. These times correspond to a maximum operating frequency of more than 5 MHz.

Figure 2:
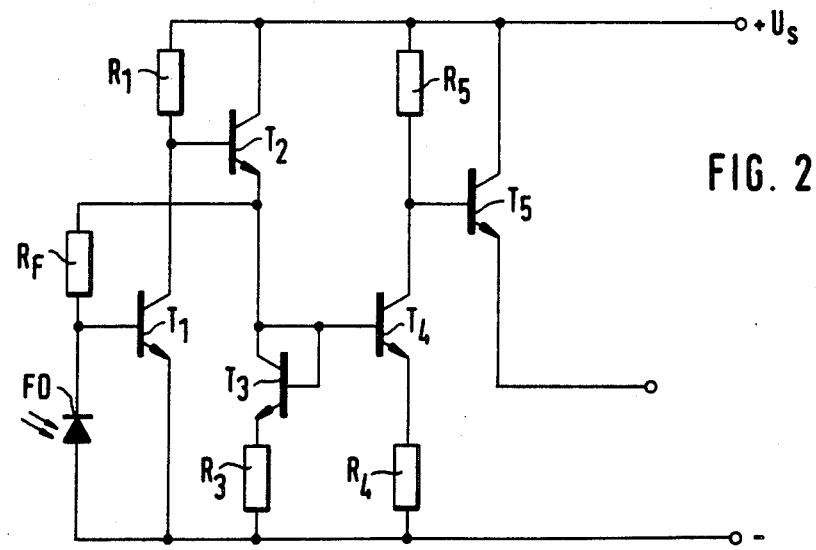
FIG. 2 shows a broad-band amplifier without a positive feedback between the fourth and the fifth transistor.

The circuit in FIG. 2 differs from the circuit of FIG. 1 in that there is no positive feedback via the resistance $R_k$ between the fourth and the fifth transistors. Owing to the omission of $R_k$ in the circuit according to FIG. 2, as opposed to the circuit of FIG. 1, there is no Schmitt trigger function. The circuit shown in FIG. 2 may be used as a linear broad-band amplifier. In the circuit of FIG. 2, the resistance R is of such dimensions that the quiescent potential at the output, i.e., at the emitter of transistor T5, becomes equal to $U_s/2$.

Figure 3:
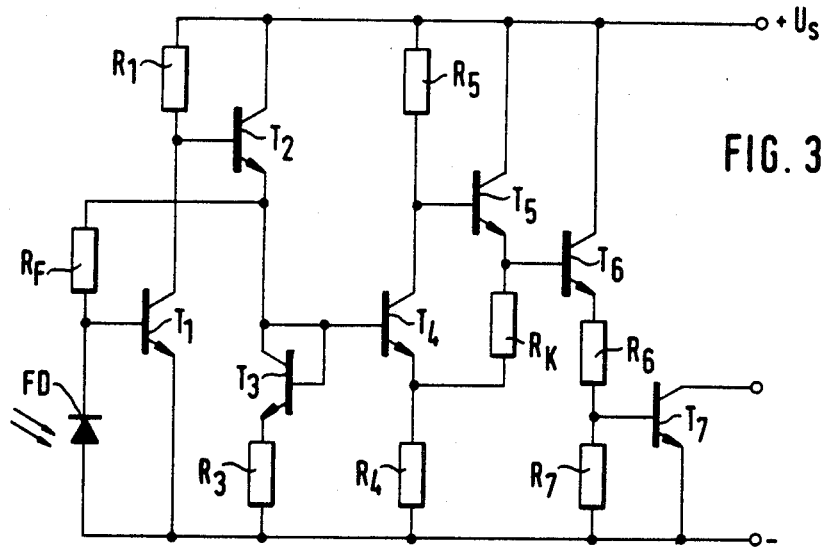
FIG. 3 shows a broad-band amplifier with an additional seventh transistor.
Figure 4:
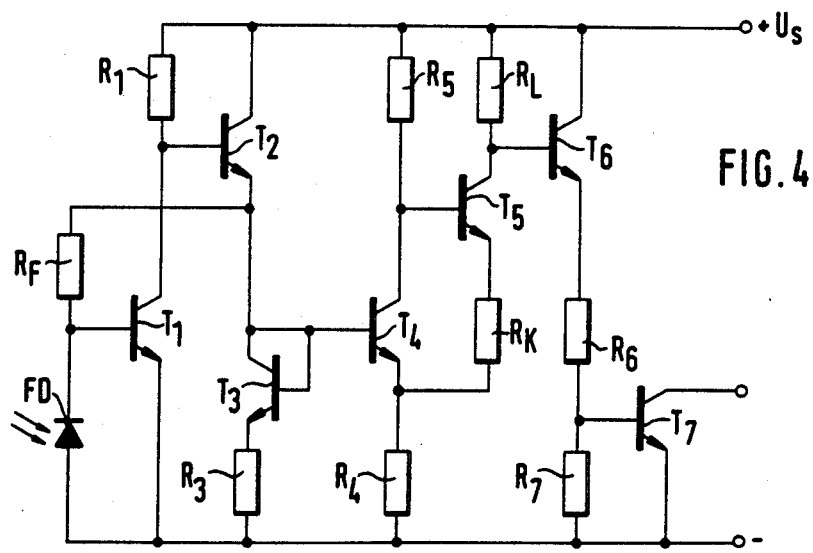
FIG. 4 shows a modified form of the amplifier shown in FIG. 3.

FIG. 3 shows the basic circuit according to FIG. 1, however, with an additional transistor T7. The seventh transistor T7 constitutes a so-called open collector output. The circuit according to FIG. 4 shows a modification of the circuit shown in FIG. 3. While the base of transistor T6 is connected to the emitter of transistor T5 in the circuit according to FIG. 3, the base of transistor T6 is connected to the collector of transistors T5 in the circuit according to FIG. 4. Consequently, the circuit according to FIG. 4 supplies an output signal which is inverted with respect to the output signal of the circuit according to FIG. 3.

What is claimed is:

1. A broad-band amplifier for the amplification of a photoelectric current triggered by a light signal with a first transistor connected to receive the photoelectric current, and a second transistor connected in series with the first transistor, wherein a resistance is connected between the base of the first transistor and the emitter of the second transistor, and a third transistor and a fourth transistor are provided which form a current mirror, in that the third transistor is connected in series with the second transistor, and a resistance is located between the third transistor and ground.

2. A broad-band amplifier according to claim 1, wherein the third transistor is connected as a diode.

3. A broad-band amplifier according to claim 1 wherein the resistance ratio of the resistance located between the base of the first transistor and the emitter of the second transistor to the resistance located between the third transistor and ground is selected such that the broad-band amplifier has a certain current amplification.

4. A broad-band amplifier according to claim 1, wherein a fifth transistor is provided and is connected with the third transistor and the fourth transistor to form a Schmitt trigger.

5. A broad-band amplifier according to claim 4, wherein the emitter of the fifth transistor is coupled with the emitter of the fourth transistor via a resistance.

6. A broad-band amplifier according to claim 4, wherein a sixth transistor is provided as an output transistor.

7. A broad-band amplifier according to claim 6, wherein the base of the sixth transistor is connected to the emitter of the fifth transistor.

8. A broad-band amplifier according to claim 6, wherein the base of the sixth transistor is connected to the collector of the fifth transistor.

9. A broad-band amplifier according to 6, wherein a seventh transistor is provided as output transistor with an open collector output.

10. A broad-band amplifier according to claim 1, wherein a resistance is connected between the emitter of the fourth transistor and ground.

11. A broad-band amplifier according to claim 1 wherein a fifth transistor is provided, the emitter of the fifth transistor being free and serving as output of the amplifier.

12. A broad-band amplifier according to claim 1 wherein the base of the first transistor constitutes the amplifier input and is connected to receive the photoelectric current triggered by the light signal.

* * * * *